(12) United States Patent
Kim

(10) Patent No.: US 10,283,581 B2
(45) Date of Patent: May 7, 2019

(54) ORGANIC LIGHT EMITTING DISPLAY DEVICE HAVING AUXILIARY LINES

(71) Applicant: LG DISPLAY CO., LTD., Seoul (KR)

(72) Inventor: Taehwan Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 38 days.

(21) Appl. No.: 14/919,182

(22) Filed: Oct. 21, 2015

(65) Prior Publication Data

US 2016/0118457 A1 Apr. 28, 2016

(30) Foreign Application Priority Data

Oct. 22, 2014 (KR) .................. 10-2014-0143122

(51) Int. Cl.
*H01L 27/32* (2006.01)
*H01L 29/24* (2006.01)
*H01L 51/52* (2006.01)
*H01L 29/786* (2006.01)

(52) U.S. Cl.
CPC .......... *H01L 27/3279* (2013.01); *H01L 29/24* (2013.01); *H01L 29/7869* (2013.01); *H01L 29/78633* (2013.01); *H01L 51/5228* (2013.01)

(58) Field of Classification Search
CPC ................. H01L 27/3279; H01L 29/24; H01L 27/3276; H01L 51/5228
USPC .................................................... 257/40, 59
See application file for complete search history.

(56) References Cited

U.S. PATENT DOCUMENTS

| 2005/0051776 | A1* | 3/2005 | Miyagi | G09G 3/3233 257/72 |
| 2006/0082284 | A1* | 4/2006 | Shibusawa | H01L 27/12 313/500 |
| 2007/0048886 | A1* | 3/2007 | Winters | H01L 51/56 438/29 |
| 2007/0241664 | A1* | 10/2007 | Sakamoto | H01L 27/3276 313/503 |
| 2008/0123013 | A1* | 5/2008 | Kim | G02F 1/136286 349/54 |
| 2008/0197778 | A1* | 8/2008 | Kubota | H01L 27/3258 315/73 |
| 2008/0246403 | A1* | 10/2008 | Sagawa | G09G 3/3233 315/35 |
| 2010/0007272 | A1* | 1/2010 | Toyoda | H01L 51/5203 313/504 |

(Continued)

*Primary Examiner* — Lex H Malsawma
*Assistant Examiner* — Eric W Jones
(74) *Attorney, Agent, or Firm* — Dentons US LLP

(57) ABSTRACT

Provided is an organic light emitting display (OLED) device that includes, for example, a thin film transistor including an active layer, a gate electrode, a source electrode, and a drain electrode; a planarization layer on the thin film transistor; an anode on the planarization layer; an organic light emitting layer on the anode; a cathode on the organic light emitting layer; a first auxiliary line on the same layer and formed of the same material as the source electrode and the drain electrode; and a second auxiliary line on the same layer and formed of the same material as the anode, wherein the first auxiliary line and the second auxiliary line cross each other with the planarization layer interposed therebetween, and wherein the first auxiliary line is electrically connected with the cathode through the second auxiliary line.

17 Claims, 11 Drawing Sheets

(56) References Cited

U.S. PATENT DOCUMENTS

| | | | | |
|---|---|---|---|---|
| 2010/0127264 A1* | 5/2010 | Bang | ............... | H01L 51/5234 |
| | | | | 257/59 |
| 2011/0260955 A1* | 10/2011 | Yoshida | ............ | H01L 27/3246 |
| | | | | 345/76 |
| 2012/0146030 A1* | 6/2012 | You | ............ | H01L 27/124 |
| | | | | 257/59 |
| 2013/0327560 A1* | 12/2013 | Ichiki | ............ | G06F 3/044 |
| | | | | 174/133 R |
| 2014/0054070 A1* | 2/2014 | Ichiki | ............ | G06F 3/044 |
| | | | | 174/253 |
| 2014/0176399 A1* | 6/2014 | Lee | ............ | G09G 3/20 |
| | | | | 345/55 |
| 2014/0183502 A1* | 7/2014 | Song | ............ | H01L 27/3246 |
| | | | | 257/40 |
| 2014/0346537 A1* | 11/2014 | Xi | ............ | H01L 27/124 |
| | | | | 257/89 |

\* cited by examiner

ORGANIC LIGHT EMITTING DISPLAY DEVICE HAVING AUXILIARY LINES

This application claims the priority of Korean Patent Application No. 10-2014-0143122 filed on Oct. 22, 2014, in the Korean Intellectual Property Office, the disclosure of which is incorporated herein by reference for all purposes as if fully set forth herein.

BACKGROUND OF THE INVENTION

Field of the Invention

The present disclosure relates to an organic light emitting display (OLED) device and a method of manufacturing the same, and more particularly, to an OLED device with reduced voltage drop in the cathode and improved aperture ratio.

Discussion of the Related Art

Organic light emitting display (OLED) devices are a self-luminous display that does not require an additional light source, different from liquid crystal display (LCD) devices. Therefore, OLED devices can be made lighter and thinner. Further, OLED devices have advantages in that they can be driven with low voltage and less power consumption, and that they represents vivid colors and have short response time, wide viewing angle and good contrast ratio (CR). For these reasons, OLED devices are currently under development as the next generation display.

In the case of a top-emission type OLED device, a transparent electrode or a semi-transmissive electrode can be used as a cathode in order to emit the light generated from an organic light emitting layer upward. In either case in which the transparent electrode or the semi-transmissive electrode is used as the cathode, the cathode has typically a small thickness in order to improve light transmittance. A decrease in thickness of the cathode increases the electric resistance of the cathode electrode. As a result, a large-area OLED device may suffer from a higher voltage drop, as the cathode is further from a voltage supply pad unit, that may cause luminance non-uniformity.

In order to minimize such a voltage drop, a method of forming a separate auxiliary electrode has been used. FIG. 1 is a schematic cross-sectional view of an OLED device that includes an auxiliary electrode according to the related art.

Referring to FIG. 1, an OLED device according to the related art includes a first auxiliary electrode 108, a second auxiliary electrode 107, a substrate 110, a buffer layer 120, a planarization layer 152, an anode 160, a bank layer 162, a partition 164, an organic layer 166, an organic light emitting layer 170, and a cathode 180.

Herein, the anode 160 and the first auxiliary electrode 107 are formed of the same material by the simultaneous process, and the organic light emitting layer 170 and the organic layer 166 are also formed of the same material by the simultaneous process. The second auxiliary electrode 108 is formed by using a separate process using a mask.

In the OLED device 100 of FIG. 1, the second auxiliary electrode 108 and the first auxiliary electrode 107, which are electrically connected with the cathode 180, is used to minimize the voltage drop to remedy the luminance non-uniformity problem of the OLED device.

However, in the OLED device 100 of FIG. 1, a sufficiently large area in each sub pixel region is desired to form the partition 164 and the first auxiliary electrode 107, which is disposed on the same layer and made of the same material as the anode 160. Because the area where the first auxiliary electrode 107 and the partition 164 are disposed typically does not contribute to the light emitting region, the aperture ratio of the OLED device 100 may be lowered.

Moreover, in order to maintain a uniform sheet resistance value, when the second auxiliary electrode 108 is disposed below the first auxiliary electrode 107 and above the planarization layer 152, a separate mask process may be required, as illustrated in FIG. 1. As a result, a manufacturing process of the OLED device 100 may become complicated, and a manufacturing time may increase.

SUMMARY OF THE INVENTION

Accordingly, the present invention is directed to provide an organic light emitting display (OLED) device and a method of manufacturing the same that substantially obviate one or more problems due to limitations and disadvantages of the related art.

An advantage of the present invention is directed to provide an OLED device with reduced voltage drop in the cathode and improved aperture ratio.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display (OLED) device having a pixel region including a plurality of sub pixel regions may, for example, include a thin film transistor including an active layer, a gate electrode, a source electrode, and a drain electrode; a planarization layer on the thin film transistor; an anode on the planarization layer; an organic light emitting layer on the anode; a cathode on the organic light emitting layer; a first auxiliary line on the same layer and formed of the same material as the source electrode and the drain electrode; and a second auxiliary line on the same layer and formed of the same material as the anode, wherein the first auxiliary line and the second auxiliary line cross each other with the planarization layer interposed therebetween, and wherein the first auxiliary line is electrically connected with the cathode through the second auxiliary line.

According to another feature of the present disclosure, an extension direction of the first auxiliary line and an extension direction of the second auxiliary line may be vertical to each other.

According to yet another feature of the present disclosure, the sub pixel region may have a quadrangular shape, and the second auxiliary line may extend parallel to a short side of the sub pixel region.

According to still another feature of the present disclosure, the first auxiliary line and the second auxiliary line may be electrically connected to each other at a point where both auxiliary lines cross each other with the planarization layer interposed therebetween.

According to still another feature of the present disclosure, the organic light emitting display device may further include a Vdd voltage line disposed on the same layer and made of the same material as the first auxiliary line.

According to still another feature of the present disclosure, the planarization layer and an inorganic layer may be disposed between the Vdd voltage line and the second auxiliary line.

According to still another feature of the present disclosure, at least one driving circuit may be disposed between the Vdd voltage line and the first auxiliary line.

According to still another feature of the present disclosure, the Vdd voltage line may include a first Vdd voltage line and a second Vdd voltage line, and at least one driving circuit may be disposed between the first Vdd voltage line and the second Vdd voltage line.

According to still another feature of the present disclosure, only a part of the first Vdd voltage line may be vertically overlapped with the anode, and only a part of the second Vdd voltage line may be vertically overlapped with the anode.

According to still another feature of the present disclosure, the width of the first Vdd voltage line and the width of the second Vdd voltage line may be the same as each other.

According to still another feature of the present disclosure, the pixel region may include four sub pixel regions, and four sub pixel regions may emit light of different colors from each other.

According to still another feature of the present disclosure, the organic light emitting display device may further include a reference line disposed on the same layer and made of the same material as the first auxiliary line.

According to still another feature of the present disclosure, two driving circuits may be disposed between the Vdd voltage line and the reference line.

According to still another feature of the present disclosure, the reference line may supply signals to four respective sub pixel regions through a first connection layer, the voltage line may supply the signals to four respective sub pixel regions through a second connection layer, and the first connection layer and the second connection layer may be disposed on the same layer and made of the same material.

According to still another feature of the present disclosure, the active layer may be configured by an oxide semiconductor, and the first connection layer and the second connection layer may block light that is introduced into the active layer.

According to still another feature of the present disclosure, the Vdd voltage line may include a first Vdd voltage line and a second Vdd voltage line, at least one driving circuit may be disposed between the first Vdd voltage line and the reference line, and at least one driving circuit may be disposed between the second Vdd voltage line and the reference line.

According to still another feature of the present disclosure, the organic light emitting display device may further include a partition disposed on the second auxiliary line.

According to still another feature of the present disclosure, the organic light emitting display device may further include a third auxiliary line disposed on the same layer and made of the same material as the anode, and the second auxiliary line and the third auxiliary line may have a mesh structure on the same layer as the anode.

According to still another feature of the present disclosure, the third auxiliary line and the first auxiliary line may be vertically overlapped with each other.

Details of other exemplary embodiments will be included in the detailed description of the disclosure and the accompanying drawings.

According to still another feature of the present disclosure, a first auxiliary electrode is disposed on the same layer as a source electrode and a drain electrode and a second auxiliary electrode is disposed on the same layer as an anode to minimize voltage drop in a cathode and enhance luminance uniformity of an organic light emitting display device.

According to still another feature of the present disclosure, a Vdd voltage line is disposed while being divided into two and an interval at which the Vdd voltage line and the anode can superimpose on each other is maximally used to significantly increase an aperture ratio of the organic light emitting display device.

According to still another feature of the present disclosure, the first auxiliary electrode is formed simultaneously when a source electrode and a drain electrode are formed to simplify a manufacturing process of the organic light emitting display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
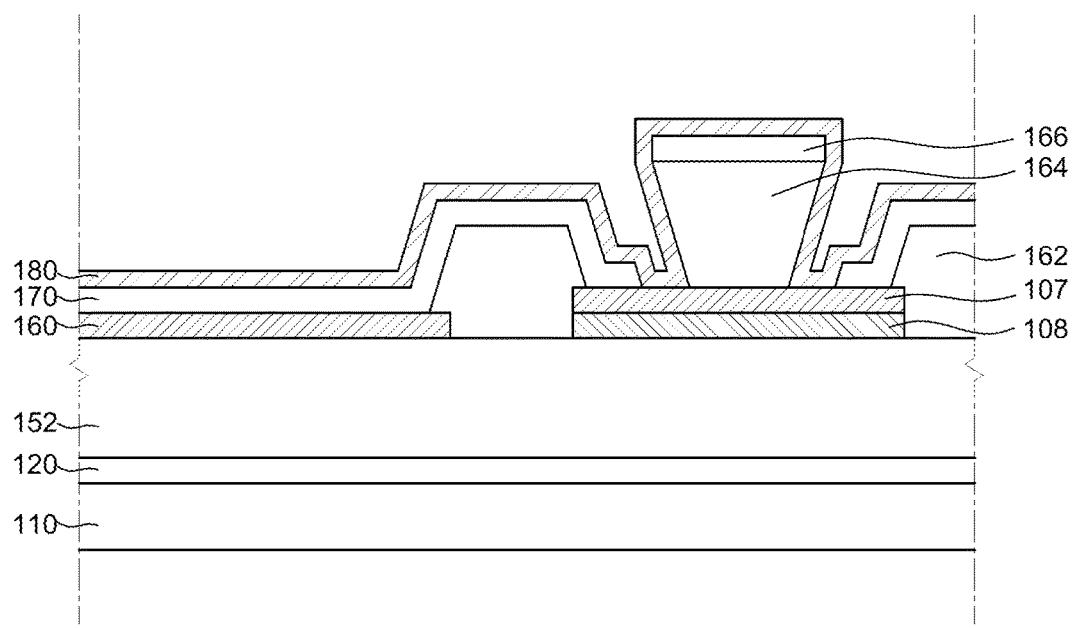
FIG. 1 is a schematic cross-sectional view of an organic light emitting display device including an auxiliary electrode according to the related art.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 2A:
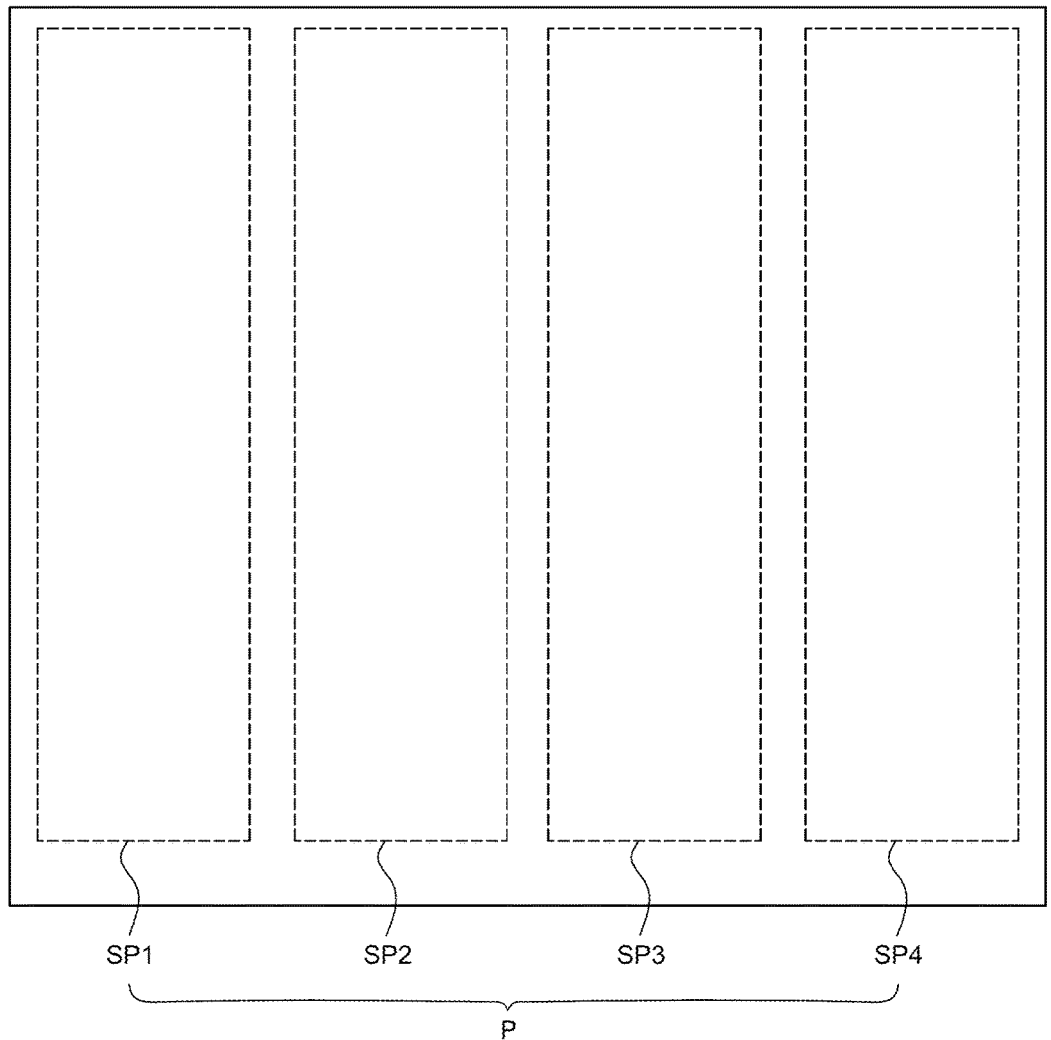
FIG. 2A is a schematic plan view of a top emission type organic light emitting display device according to an exemplary embodiment of the present disclosure.

FIG. 2A is a schematic plan view of a top emission type organic light emitting display (OLED) device according to an exemplary embodiment of the present disclosure.

Referring to FIG. 2A, the OLED device 200 according to the exemplary embodiment of the present disclosure includes a pixel region P. Only one pixel region P is illustrated in FIG. 2a, but the OLED device 200 includes a plurality of pixel regions P. The pixel region P includes a plurality of sub pixel regions SP1, SP2, SP3, and SP4, and each sub pixel region displays a respective color. As illustrated in FIG. 2A, one pixel region P may include a first sub pixel region SP1, a second sub pixel region SP2, a third sub pixel region SP3, and a fourth sub pixel region SP4. The first sub pixel region SP1, the second sub pixel region SP2, the third sub pixel region SP3, and the fourth sub pixel region SP4 emit light of different colors from each other, respectively. In detail, each sub pixel region emits light of any one color of red, green, blue, and white colors.

Figure 2B:
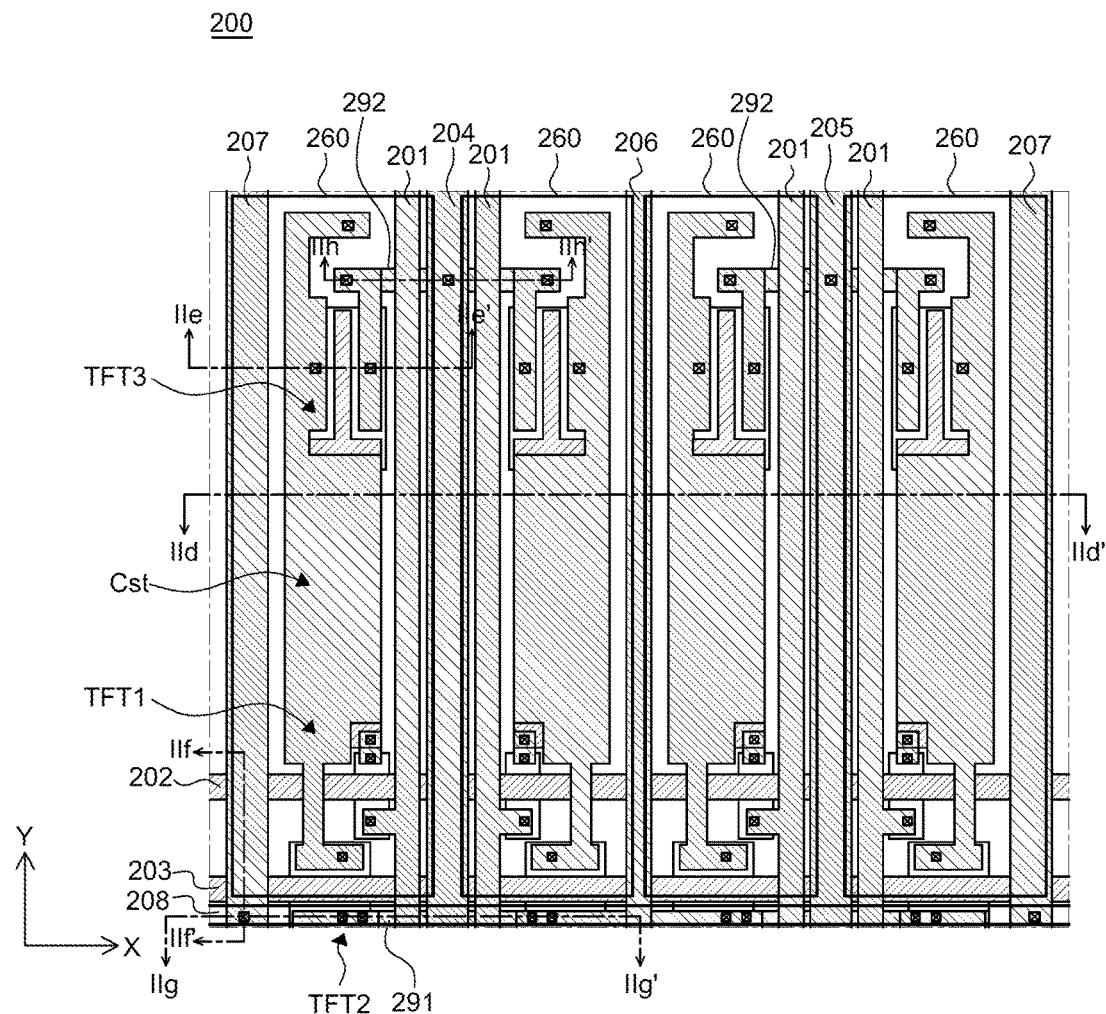
FIG. 2B is a diagram of the organic light emitting display device according to the exemplary embodiment of the present disclosure of FIG. 2A.
Figure 2C:
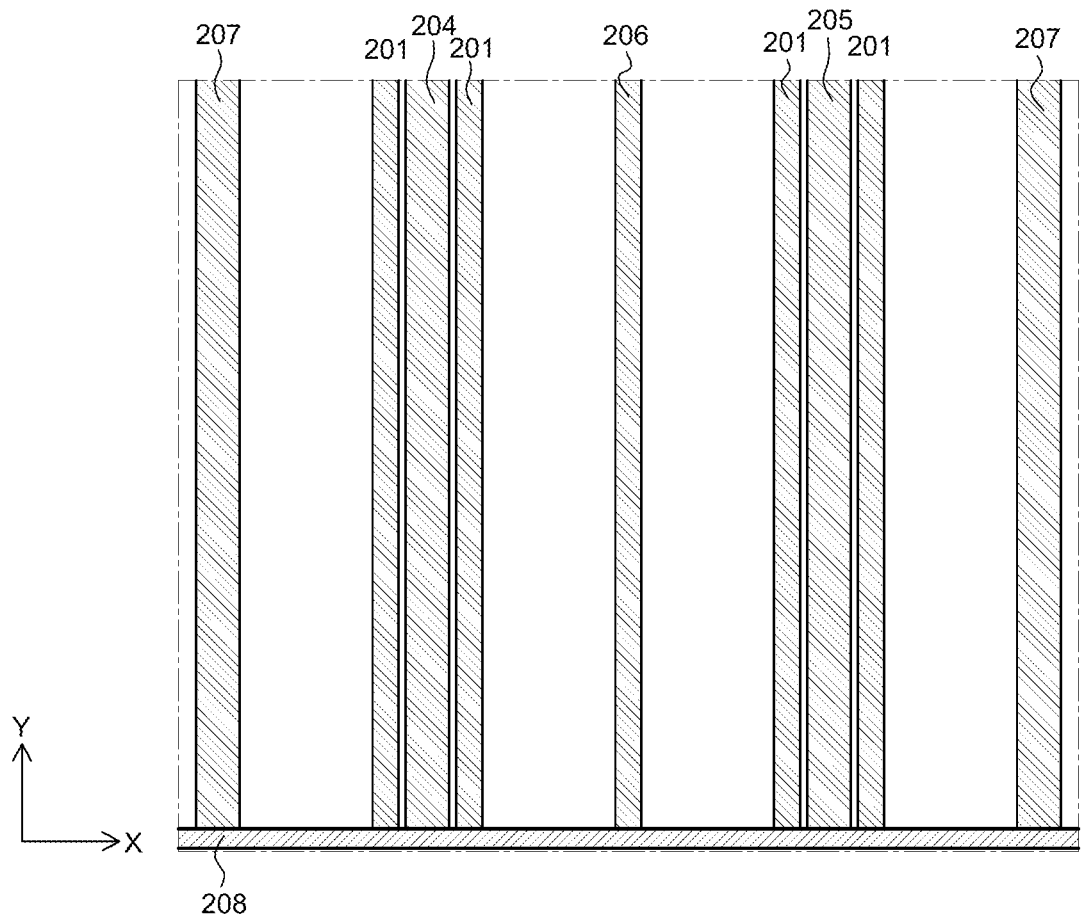
FIG. 2C is a schematic plan view illustrating a data line, a first Vdd voltage line, a second Vdd voltage line, a reference line, a first auxiliary line, and a second auxiliary line in the organic light emitting display device of FIG. 2B.

FIG. 2B is a diagram of the OLED device according to the exemplary embodiment of the present disclosure of FIG. 2A, and FIG. 2C is a schematic plan view illustrating a data line, a first Vdd voltage line, a second Vdd voltage line, a reference line, a first auxiliary line, and a second auxiliary line in the OLED device of FIG. 2B.

Referring to FIGS. 2B and 2C, the OLED device 200 according to the exemplary embodiment of the present disclosure includes a data line 201, a first scan line 202 and a second scan line 203, a first Vdd voltage line 204, a second Vdd voltage line 205, a reference line 206, a first auxiliary line 207, a second auxiliary line 208, thin film transistors TFT1, TFT2, and TFT3, a capacitor Cst, an anode 260, a first connection layer 291, and a second connection layer 292.

The data line 201 is allocated to each of the first sub pixel region SP1, the second sub pixel region SP2, the third sub pixel region SP3, and the fourth sub pixel region SP4 to serve to transfer a signal to the first thin film transistor TFT1. The data line 201 extends in a direction vertical to an array direction of the sub pixel regions SP1, SP2, SP3, and SP4, that is, a Y-axis direction.

The first scan line 202 serves to transfer a scan signal to the first thin film transistor TFT1 of each of the first sub pixel region SP1, the second sub pixel region SP2, the third sub pixel region SP3, and the fourth sub pixel region SP4. Further, the second scan line 203 serves to transfer a signal to a second thin film transistor TFT2 to each of the first sub pixel region SP1, the second sub pixel region SP2, the third sub pixel region SP3, and the fourth sub pixel region SP4. The first scan line 202 and the second scan line 203 extend in a direction parallel to the array direction of the sub pixel regions SP1, SP2, SP3, and SP4, that is, an X-axis direction.

The Vdd voltage lines 204 and 205 serve to transfer Vdd voltage to a third thin film transistor TFT3 of each of the first sub pixel region SP1, the second sub pixel region SP2, the third sub pixel region SP3, and the fourth sub pixel region SP4. The Vdd voltage lines 204 and 205 extend in the direction vertical to the array direction of the sub pixel regions SP1, SP2, SP3, and SP4, that is, the Y-axis direction.

Referring to FIGS. 2B and 2C, in the OLED device 200 according to the exemplary embodiment of the present disclosure, the Vdd voltage lines 204 and 205 include two Vdd voltage lines, that is, the first Vdd voltage line 204 and the second Vdd voltage line 205. The first Vdd voltage line 204 serves to transfer the Vdd voltage to the third thin film transistor TFT3 of each of two sub pixel regions, that is, the first sub pixel region SP1 and the second sub pixel region SP2. The second Vdd voltage line 205 also serves to transfer the Vdd voltage to the third thin film transistor TFT3 of each of two sub pixel regions, that is, the third sub pixel region SP3 and the fourth sub pixel region SP4. Herein, the width of the first Vdd voltage line 204 and the width of the second Vdd voltage line 205 may be the same as each other. Further, as illustrated in FIG. 2B, at least one driving circuit may be disposed between the first Vdd voltage line 204 and the second Vdd voltage line 205.

The reference line 206 serves to transfer reference voltage to the second thin film transistor TFT2 of each of the first sub pixel region SP1, the second sub pixel region SP2, the third sub pixel region SP3, and the fourth sub pixel region SP4. The reference line 206 extends in the direction vertical to the array direction of the sub pixel regions SP1, SP2, SP3, and SP4, that is, the Y-axis direction. However, the reference line 206 may be omitted, when, for example, the thin film transistor of the driving circuit is constituted by two. At least one driving circuit, for example, one driving circuit may be disposed between the reference line 206 and the first Vdd voltage line 204, as illustrated in FIG. 2B. Also, at least one driving circuit, for example, one driving circuit may be disposed between the reference line 206 and the second Vdd voltage line 205, as illustrated in FIG. 2B.

The first auxiliary line 207 and the second auxiliary line 208 transfer to Vss voltage to the cathode 280 to serve to supplement (or compensate) the voltage drop in the cathode 280. The first auxiliary line 207 extends in the direction vertical to the array direction of the first sub pixel region SP1, the second sub pixel region SP2, the third sub pixel region SP3, and the fourth sub pixel region SP4, that is, the Y-axis direction. Further, the second auxiliary line 208 extends in the direction parallel to the array direction of the first sub pixel region SP1, the second sub pixel region SP2, the third sub pixel region SP3, and the fourth sub pixel region SP4, that is, the X-axis direction.

Figure 2D:
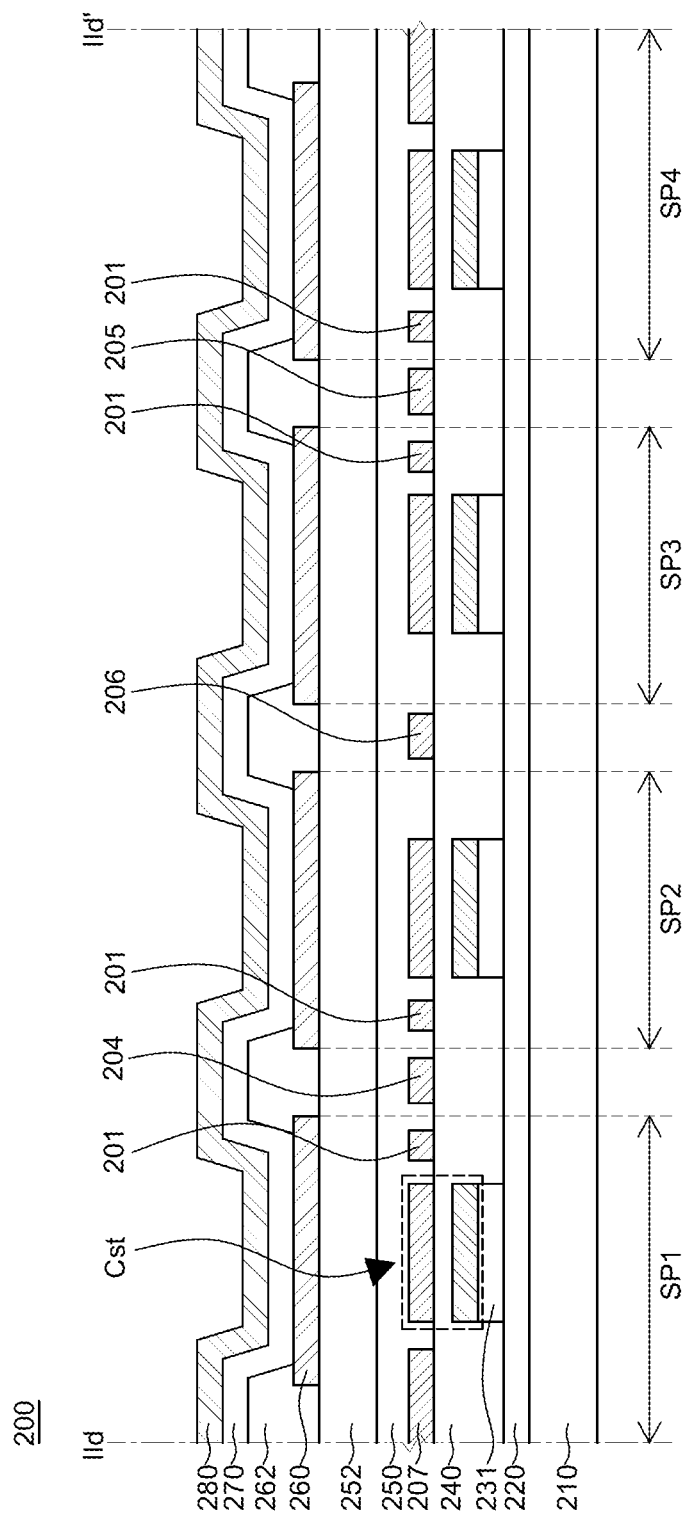
FIG. 2D is a schematic cross-sectional view of the organic light emitting display device according to the exemplary embodiment of the present disclosure taken along line IId-IId'.

As illustrated in FIG. 2D, as the first auxiliary line 207 and the second auxiliary line 208 are formed in a mesh structure interposed between the organic material layer 250 and the planarization layer 252, the voltage drop in the cathode 280 may be more effectively supplemented. The first auxiliary line 207 and the second auxiliary line 208 may be electrically connected to each other through contact holes formed in the organic material layer 250 and the planarization layer 252, at an area where the first auxiliary line 207 and the second auxiliary line 208 cross each other with the organic material layer 250 and the planarization layer 252 interposed between the first auxiliary line 207 and the second auxiliary line 208.

At least one driving circuit may be disposed between the first auxiliary line 207 and the Vdd voltage lines 204 and 205. For example, as illustrated in FIG. 2B, one driving circuit may be disposed between the first auxiliary line 207 and the first Vdd voltage line 204, and one driving circuit may be disposed between the first auxiliary line 207 and the second Vdd voltage line 205.

The data line 201, the Vdd voltage lines 204 and 205, and the reference line 206 may be disposed on the same layer and made of the same material as the source electrode and the drain electrode. In particular, the first auxiliary line 207 may be disposed on the same layer and made of the same material as the source electrode and the drain electrode. Further, the second auxiliary line 208 may be disposed on the same layer and made of the same material as the anode 260, which will now be described in more detail.

The thin film transistors TFT1, TFT2, and TFT3 serve to drive the OLED device 200. The thin film transistors TFT1, TFT2, and TFT3 include the first thin film transistor TFT1, the second thin film transistor TFT2, and the third thin film transistor TFT3. The first thin film transistor TFT1 is driven by the scan signal applied to the first scan line 202 and the second thin film transistor TFT2 is driven by the scan signal applied to the second scan line 203. The thin film transistors TFT1, TFT2, and TFT3 will now be further described with reference to FIGS. 2D to 2H.

The capacitor Cst serves to acquire capacitance. The first thin film transistor TFT1, the second thin film transistor TFT2, the third thin film transistor TFT3, and the capacitor Cst form one driving circuit for driving one sub pixel region SP1, SP2, SP3, or SP4. Referring to FIG. 2D, an upper electrode of the capacitor Cst may be disposed on the same layer and made of the same material as the source electrode and the drain electrode. Moreover, a lower electrode of the capacitor Cst may be disposed on the same layer and made of the same material as the first scan line 202 and the second scan line 203.

Meanwhile, the anode 260, the first connection layer 290, and the second connection layer 292 will now be described with reference to FIGS. 2D to 2H.

In FIG. 2B, it is illustrated that the driving circuit for driving one sub pixel region SP1, SP2, SP3, or SP4 is constituted by three thin film transistors TFT1, TFT2, and TFT3 and one capacitor Cst. However, the number of thin film transistors and the number of capacitors are not particularly limited thereto and may be variously modified.

Figure 2E:
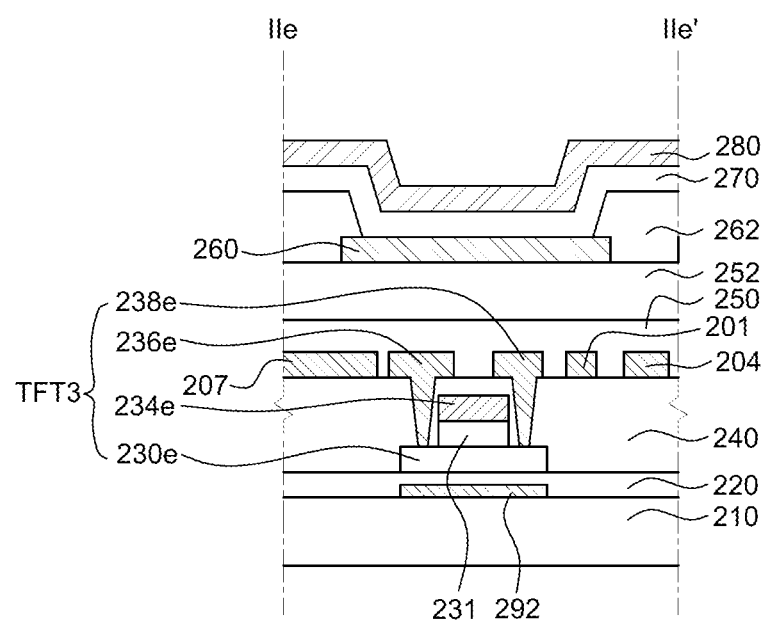
FIG. 2E is a schematic cross-sectional view of the organic light emitting display device according to the exemplary embodiment of the present disclosure taken along line IIe-IIe'.
Figure 2F:
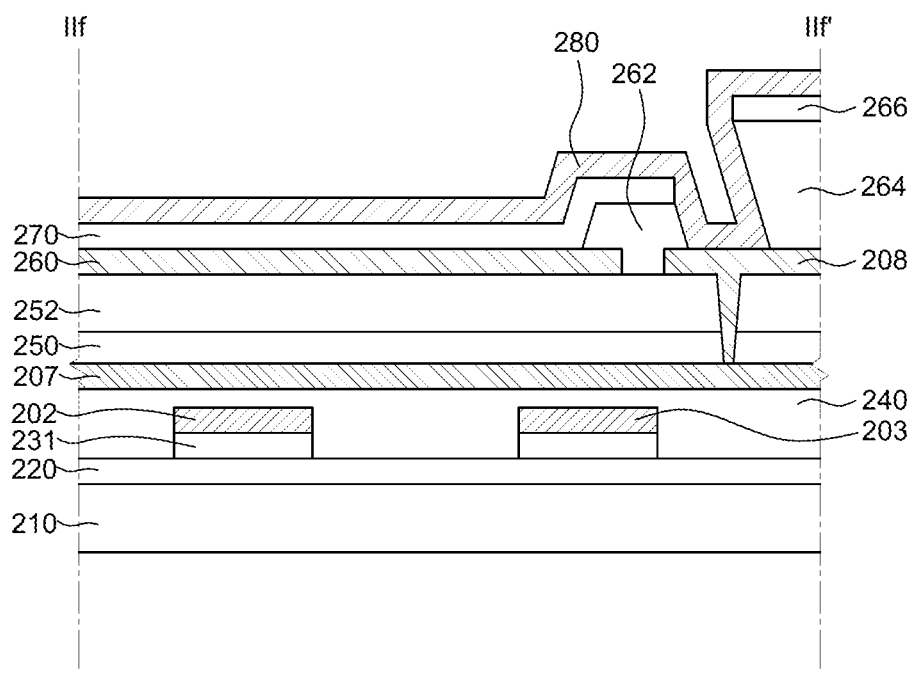
FIG. 2F is a schematic cross-sectional view of the organic light emitting display device according to the exemplary embodiment of the present disclosure taken along line IIf-IIf'.
Figure 2G:
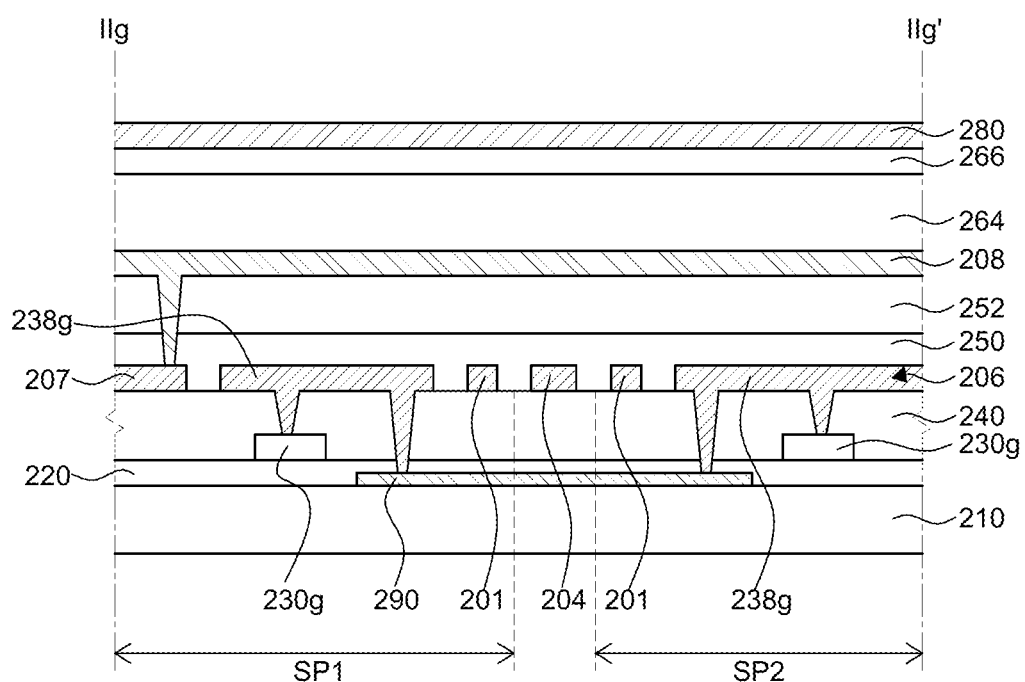
FIG. 2G is a schematic cross-sectional view of the organic light emitting display device according to the exemplary embodiment of the present disclosure taken along line IIg-IIg'.
Figure 2H:
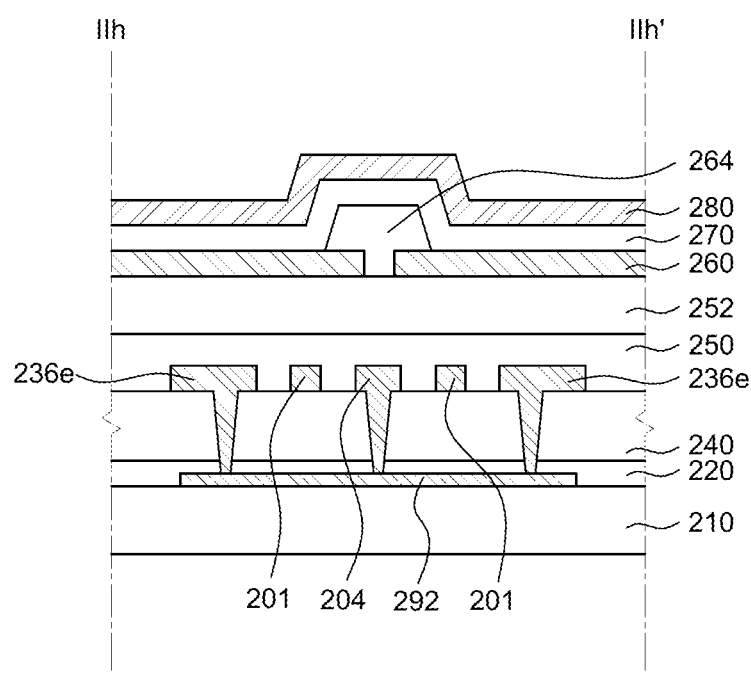
FIG. 2H is a schematic cross-sectional view of the organic light emitting display device according to the exemplary embodiment of the present disclosure taken along line IIh-IIh'.

FIG. 2D is a schematic cross-sectional view of the OLED device according to the exemplary embodiment of the present disclosure taken along line IId-IId'. FIG. 2E is a schematic cross-sectional view of the OLED device according to the exemplary embodiment of the present disclosure taken along line IIe-IIe'. FIG. 2F is a schematic cross-sectional view of the OLED device according to the exemplary embodiment of the present disclosure taken along line IIf-IIf'. FIG. 2G is a schematic cross-sectional view of the OLED device according to the exemplary embodiment of the present disclosure taken along line IIg-IIg', and FIG. 2H is a schematic cross-sectional view of the OLED device according to the exemplary embodiment of the present disclosure taken along line IIh-IIh'.

Referring to FIGS. 2D to 2H, the OLED device 200 further includes a substrate 210, a buffer layer 220, a gate insulating layer 231, an interlayer insulating layer 240, the inorganic layer 250, the planarization layer 252, the anode 260, a bank layer 262, a partition 264, an organic layer 266, an organic light emitting layer 270, the cathode 280, the first connection layer 290, and the second connection layer 292.

The substrate 210 is used for supporting various components of the OLED device 200. The substrate 210 may be made of a material having transparency and flexibility.

The buffer layer 220 is disposed on the substrate 210. The buffer layer 220 is used to suppress penetration of moisture or impurities through the substrate 210 and planarizes the top of the substrate 210. However, the buffer layer 220 may be omitted depending on, for example, the type of the substrate 210 or the types of the thin film transistors TFT1, TFT2, and TFT3 used in the OLED device 200. The buffer layer 220 may be made of a transparent material.

As illustrated in FIG. 2E, the third thin film transistor TFT3 includes an active layer 230e formed on the buffer layer 220, a gate electrode 234e formed on the gate insulating layer 231, and a source electrode 236e and a drain electrode 238e formed on the interlayer insulating layer 240. The active layer 230e is made of a semiconductor material, for example, an oxide semiconductor material and serves as a channel of the third thin film transistor TFT3. The gate electrode 234e is disposed on the same layer and made of the same material as the first scan line 202 and the second scan line 203. The source electrode 236e and the drain electrode 238e are disposed on the same layer and made of the same material as the first auxiliary line 207, the Vdd voltage lines 204 and 205, the data line 201, and the reference line 206.

In FIGS. 2D to 2H, it is illustrated that the thin film transistor has a coplanar structure for ease of description, but is not limited thereto and the thin film transistor may have an inverted staggered structure. Further, although not illustrated in detail in FIGS. 2D to 2H, the first thin film transistor TFT1 and the second thin film transistor TFT2 also include the active layer, the gate electrode, the source electrode, and the drain electrode. In FIG. 2G, an active layer 234e and a drain electrode 238e of the second thin film transistor TFT2 may be verified.

As illustrated in FIGS. 2B and 2C, in the OLED device 200, the second auxiliary line 208 and the first Vdd voltage line 204, and the second auxiliary line 208 and the second Vdd voltage line 205 may not be crossed with each other. At least two layers for securing a distance, for example, the inorganic layer 250 and the planarization layer 252 are disposed between the second auxiliary line 208 and the first Vdd voltage line 204 and between the second auxiliary line 208 and the second Vdd voltage line 205 in order to reduce or minimize interference between two lines supplying high voltage.

The inorganic layer 250 is disposed on the thin film transistors TFT1, TFT2, and TFT3. The inorganic layer 250 serves to insulate components from the outside that are disposed on the same layer and made of the same material as the source electrode 236e. The inorganic layer 250 may be made of silicon nitride or silicon oxide, but is not particularly limited thereto.

The planarization layer 252 is formed on the inorganic layer 250. The planarization layer 252 serves to planarize the top of the substrate and may be designated as an overcoating layer. Contact holes for electrically connecting the source electrode of the thin film transistors TFT1, TFT2, and TFT3 and the anode 260 are formed on the inorganic layer 250 and the planarization layer 252. Further, contact holes for connecting the first auxiliary line 207 and the second auxiliary line 208 are formed on the inorganic layer 250 and the planarization layer 252.

The anode 260 is formed on the planarization layer 252. The anode 260 serves to apply a voltage to the organic light emitting layer 270. As illustrated in FIG. 2D, the anode 260 is separated for each of the sub pixel regions SP1, SP2, SP3, and SP4. The anode 260 may be formed of a transparent conductive material having a high work function and a reflection plate. Herein, the transparent conductive material may include indium tin oxide (ITO), indium zinc oxide (IZO), and indium tin zinc oxide (ITZO). In FIGS. 2D to 2H, the anode 260 is expressed as one layer for illustration purposes.

The bank layer 262 is disposed on the planarization layer 252 to cover an edge of the anode 260. The bank layer 262 serves to divide the sub pixel regions SP1, SP2, SP3, and SP4. The bank layer 262 may be formed of any one of transparent organic insulating materials, for example, polyimide, photo acryl, and benzocyclobutene (BCB) or a material exhibiting a black color, for example, a black resin.

The organic light emitting layer 270 is disposed on the anode 260 and the bank layer 262. As illustrated in FIG. 2D, the organic light emitting layer 270 may be commonly formed on the first sub pixel region SP1, the second sub pixel region SP2, the third sub pixel region SP3, and the fourth sub pixel region SP4. The organic light emitting layer 270 serves to emit light by receiving a voltage from the anode 260 and the cathode 280. Although not illustrated in FIGS. 2D to 2H, the organic light emitting layer 270 may include a hole injection layer, a hole transport layer, an electron transport layer, and an electron injection layer.

The cathode 280 is disposed on the organic light emitting layer 270. The cathode 280 serves to apply a voltage to the organic light emitting layer 270. The cathode 280 contacts the second auxiliary line 208 and is electrically connected with the first auxiliary line 207 through the second auxiliary line 208. A voltage drop in the cathode 280 may be sufficiently enhanced by the first auxiliary line 207 and the second auxiliary line 208. The cathode 280 may be formed of the transparent conductive materials such as indium tin oxide (ITO), indium zinc oxide (IZO), and indium tin zinc oxide (ITZO).

Referring to FIGS. 2F and 2G, the partition 264 is disposed on the second auxiliary line 208. The partition 264 serves to cut off the organic light emitting layer 270. The cathode 280 may be formed to contact the second auxiliary line 208 by the partition 264. As illustrated in FIG. 2F, the partition 264 may have a reverse tapered shape and be formed of an insulating material. The organic layer 266 formed of the same material as the organic light emitting layer 270 may be disposed on the partition 264.

Referring to FIG. 2G, the first connection layer 290 disposed on the substrate 210 is used in order for the reference line 206 to supply signals to four respective sub pixel regions SP1, SP2, SP3, and SP4. In detail, the reference line 206 is connected with the drain electrode 238g of the second thin film transistor TFT2 of the second sub pixel region SP2 and is also connected with the drain electrode 238g of the second thin film transistor TFT2 of the sub pixel region SP1 through the first connection layer 290. Herein, the first connection layer 290 may be a light blocking metallic layer that blocks the light introduced into the active layer 234g when the active layer 234g is constituted by an oxide semiconductor.

Further, the second connection layer 292 disposed on the substrate 210 is used in order for the first Vdd voltage line 204 and the second Vdd voltage line 205 to supply the signals to four respective sub pixel regions SP1, SP2, SP3, and SP4. In detail, referring to FIG. 2H, the first Vdd voltage line 204 is connected with the source electrode 236e of the third thin film transistor TFT3 of the first sub pixel region SP1 and the source electrode 236e of the TFT3 of the second sub pixel region SP2 through the second connection layer 292. Although not illustrated in FIG. 2H, the second Vdd voltage line 205 is also connected with the source electrode of the third thin film transistor TFT3 of the third sub pixel region SP3 and the source electrode of the third thin film transistor TFT3 of the fourth sub pixel region SP4 through the second connection layer 292. Herein, the second connection layer 292 may also be a light blocking metallic layer that blocks the light introduced into the active layer when the active layer is constituted by the oxide semiconductor.

The first connection layer 290 for the reference line 206 to supply the signals to four respective sub pixel regions SP1, SP2, SP3, and SP4 and the second connection layer 292 for the first Vdd voltage line 204 and the second Vdd voltage line 205 to supply the signals to four respective sub pixel regions SP1, SP2, SP3, and SP4 may be disposed on the same layer and formed of the same material.

As illustrated in FIGS. 2F and 2G, the first auxiliary line 207 is disposed on the same layer and formed of the same material as the source electrode and the drain electrode 238g. The second auxiliary line 208 is disposed on the same and formed of the same material as the anode 260. Moreover, the first auxiliary line 207 is electrically connected with the second auxiliary line 208 and the cathode 280 through the contact holes formed on the inorganic layer 250 and the planarization layer 252. In addition, as illustrated in FIGS. 2B, 2C, 2F, and 2G, the first auxiliary line 207 and the second auxiliary line 208 cross each other with the planarization layer 252 interposed therebetween. In other words, they extend while being vertical to each other.

Herein, the first auxiliary line 207, the source electrode, and the drain electrode 238g may be simultaneously formed by the same process and the second auxiliary line 208 and the anode 260 may be simultaneously formed by the same process.

In the OLED device according to the related art, while the auxiliary electrode for enhancing the voltage drop in the cathode has a mesh structure, the auxiliary electrode is disposed on the same layer and made of the same material as the anode. As a result, the voltage drop in the cathode can be enhanced, but since a sufficiently large area for disposing the auxiliary electrode between the anodes is desired to be secured, the aperture ratio of the OLED device may significantly deteriorate.

In order to address such a problem, several methods have been used such as reducing the interval between the anodes by reducing the width of the auxiliary electrode and incorporating a separate additional electrode below the auxiliary electrode in order to compensate for deterioration of the sheet resistance. However, disposing a separate additional electrode below the auxiliary electrode may require a separate mask process.

In the OLED device 200 according to the exemplary embodiment of the present disclosure, the first auxiliary line 207 for enhancing the voltage drop in the cathode 280 is disposed on the same layer and is formed of the same material as the source electrode and the drain electrode. Further, the second auxiliary line 208 that crosses the first auxiliary line 207 with the planarization layer 252 interposed therebetween is disposed on the same layer and is formed of the same material as the anode 260. Accordingly, the first auxiliary line 207 made of the same material as the anode 260 is not disposed, and the first auxiliary line 207 is disposed to vertically superimpose on the anode 260 in at least one direction of the X-axis direction and the Y-axis direction, for example, in the Y-axis direction, as illustrated in FIG. 2B.

As a result, the aperture ratio of the OLED device 200 can be improved. Further, the voltage drop in the cathode 280 may be effectively supplement or compensated, and the uniform sheet resistance may be maintained by the two auxiliary lines 207 and 208, as the first auxiliary line 207 and the second auxiliary line 208 are formed in a mesh structure with the planarization layer 252 interposed therebetween, without incorporating a separate mask process for forming a separate additional electrode below the auxiliary lines 207 and 208.

As described above, in the OLED device according to the exemplary embodiment of the present disclosure, the first auxiliary line 207 formed of the same material as the anode 260 may not need to be disposed in at least one direction of the X-axis direction and the Y-axis direction. Further, the second auxiliary line 208 is just disposed in the residual one direction. As illustrated in FIGS. 2B and 2C, in the OLED device 200 according to the exemplary embodiment of the present disclosure, the second auxiliary line 208 is disposed parallel to a short side of the sub pixel region SP1, SP2, SP3, or SP4 when the sub pixel regions SP1, SP2, SP3, and SP4 have a quadrangular shape in order to increase the aperture ratio.

When a Vdd voltage line is disposed in an OLED device, only a part of the Vdd voltage line is typically disposed to superimpose on the anode and the anode, and the Vdd voltage line is not disposed to completely superimpose on each other. A design limitation that the anode may not be disposed at a position where the anode completely superimposes on the Vdd voltage line becomes a primary cause that the aperture ratio of the OLED device deteriorates due to the increased interval between the anodes.

In the OLED device 200 according to the exemplary embodiment of the present disclosure, by using the point that only a part of Vdd voltage line superimposes the anode 260, it is designed in such a manner that the Vdd voltage line is divided into the first Vdd voltage line 204 and the second Vdd voltage line 205. And, it is designed in such a manner that a part of the first Vdd voltage line 204 superimposes on the anode 260 and a part of the second Vdd voltage line 205 superimposes on the anode 260, as illustrated in FIG. 2b. As a result, since the interval in which the Vdd voltage line and the anode 260 may superimpose on each other may be maximally used, the aperture ratio of the OLED device 200 may be further improved.

For example, when the interval in which one anode 260 and the Vdd voltage line may superimpose on each other is, for example, 10 μm, since the Vdd voltage line may just superimpose on two anodes 260 at the time of designing the Vdd voltage line with one, the interval in which the Vdd voltage line and the anode 260 may superimpose on each other is 20 μm. However, since two Vdd voltage lines may superimpose on four anodes 260 at the time of designing the Vdd voltage line to be divided into two, the interval in which the Vdd voltage line and the anode 260 may superimpose on each other becomes 40 μm. Thus, the aperture ratio of the OLED device 200 may be further improved.

Meanwhile, although not illustrated in FIGS. 2B and 2C, one driving circuit is configured to include only the first thin film transistor TFT1, the third thin film transistor TFT3, and the capacitor Cst and the reference line 206 may be omitted. Further, although not illustrated in FIGS. 2B and 2C, one pixel region P is designed to include three sub pixel regions SP1, SP2, and SP3 and thereafter, one data line 201 may be omitted. In this case, three respective sub pixel regions SP1, SP2, and SP3 emit different colors. In detail, light of any one color of a red color, a green color, and a blue color may be emitted.

Figure 3:
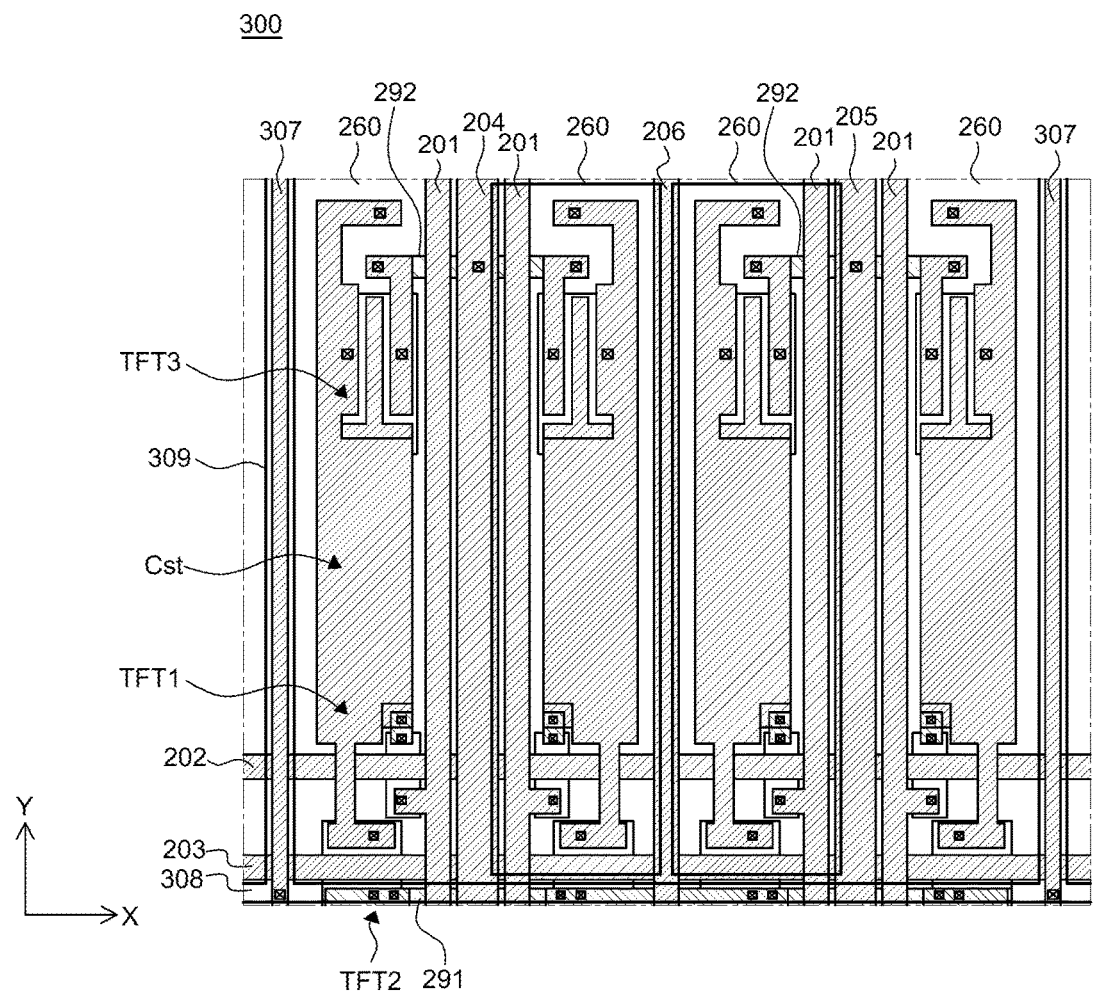
FIG. 3 is a schematic cross-sectional view of an organic light emitting display device according to another exemplary embodiment of the present disclosure.

FIG. 3 is a schematic cross-sectional view of an OLED device according to another exemplary embodiment of the present disclosure. Constitutively, FIG. 3 corresponds to FIG. 2B illustrating the lines, the thin film transistor, and the capacitor of the OLED device according to the exemplary embodiment of the present disclosure.

The OLED device 300 of FIG. 3 according to another exemplary embodiment of the present disclosure is different from the OLED device of FIG. 2 in that the OLED device 300 further includes a third auxiliary line 309. In fact, the OLED device 300 is substantially the same as the organic light display device of FIG. 2 in other configurations, and thus, a duplicated description will be omitted.

Referring to FIG. 3, in the OLED device 300 according to another exemplary embodiment of the present disclosure, the third auxiliary line 309 is disposed parallel to a direction vertical to a second auxiliary line 308, that is, the Y-axis direction. The third auxiliary line 309 is disposed on the same layer and made of the same material as the anode 260. That is, the third auxiliary line 309 is disposed on the same layer and is formed of the same material as the second auxiliary line 308 and has the mesh structure on the same layer as the anode 260.

In the OLED device 300 according to another exemplary embodiment of the present disclosure, when the same sheet resistance value is desired from the auxiliary line, since the third auxiliary line 309 is further disposed on the same layer as the anode 260, the width of the first auxiliary line 307 can be reduced, as illustrated in FIG. 3. As the OLED device has a higher resolution, the width of the sub pixel region is reduced, and the source electrode and the drain electrode are further desired to be particularly disposed on the same layer as the first auxiliary line 307 below the anode 260. Because the width of the first auxiliary line 307 can be further reduced, the OLED device 300 can be more advantageous to a high-resolution OLED device.

Figure 4:
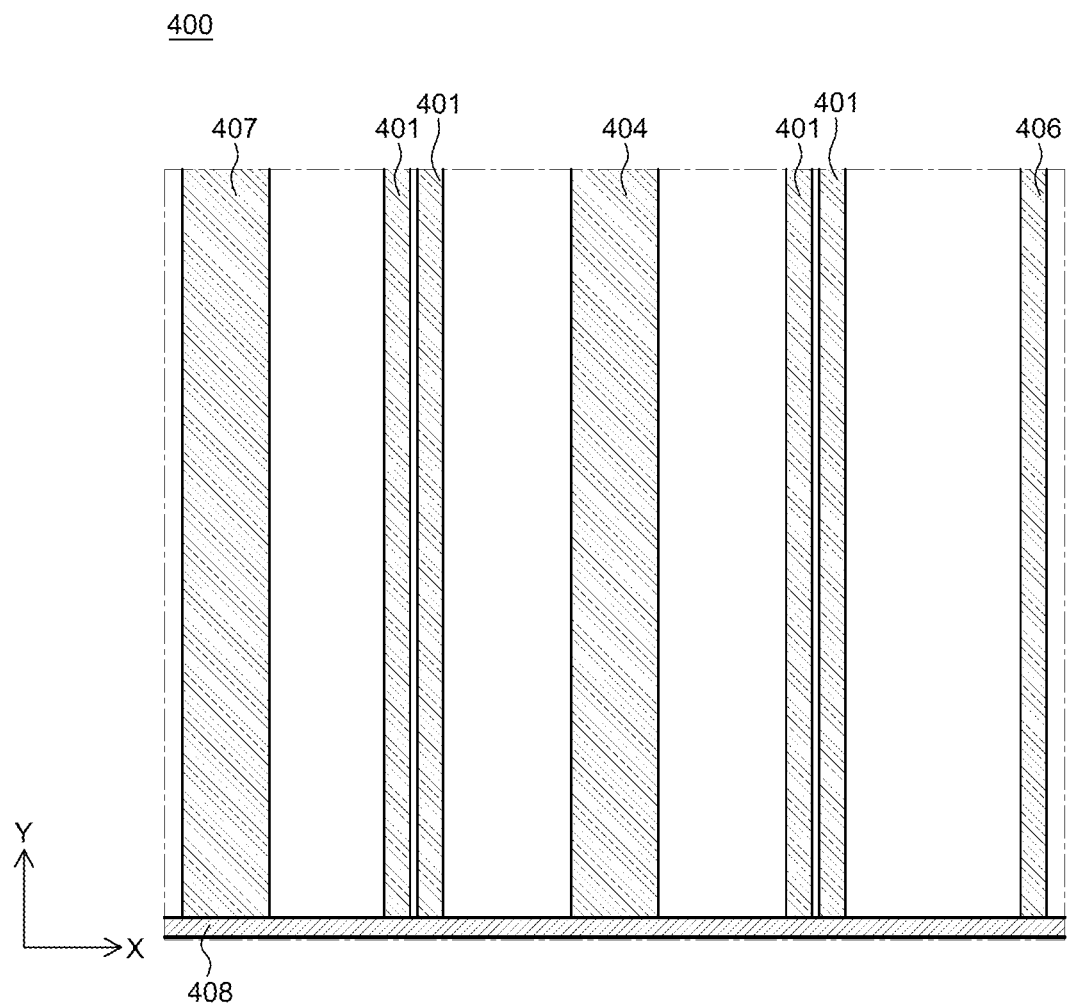
FIG. 4 is a schematic cross-sectional view of an organic light emitting display device according to yet another exemplary embodiment of the present disclosure.

FIG. 4 is a schematic cross-sectional view of an OLED device according to yet another exemplary embodiment of the present disclosure. Constitutively, FIG. 4 corresponds to FIG. 2C illustrating the lines of the OLED device according to the exemplary embodiment of the present disclosure. For ease of description, a separate driving circuit is not illustrated in FIG. 4.

Referring to FIG. 4, the OLED device according to yet another exemplary embodiment of the present disclosure includes a data line 401, a Vdd voltage line 404, a reference line 406, a first auxiliary line 407, and a second auxiliary line 408. The OLED device 400 of FIG. 4 is different from the OLED device 200 of FIG. 2 in that one pixel region includes one Vdd voltage line 404. Further, the OLED device 400 is substantially the same as the OLED device 200 in other configurations, and thus, a duplicated description will be omitted.

Referring to FIG. 4, in the OLED device 400 according to yet another exemplary embodiment of the present disclosure, one pixel region includes only one Vdd voltage line 404. In addition, two driving circuits are disposed between the reference line 406 and the Vdd voltage line 404 and the driving circuit is not disposed between the reference line 406 and the first auxiliary line 407.

The Vdd voltage line 404 supplies the Vdd voltage to each of four pixel regions and the reference line 406 supplies the reference voltage to each of four pixel regions. When the Vdd voltage line 404 and the reference line 406 are disposed like the OLED device 400 according to yet another exemplary embodiment of the present disclosure, lines supplied from the Vdd voltage line 404 to four respective pixel regions do not pass through the reference line 406. Also, the lines supplied to four respective pixel regions from the reference line 406 do not pass through the Vdd voltage line 404.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. Therefore, it should be appreciated that the exemplary embodiments described above are exemplificative in all aspects and not limitative. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display device having a pixel region including a plurality of sub pixel regions, the device comprising:
    a thin film transistor including an active layer, a gate electrode, a source electrode, and a drain electrode;
    an inorganic layer and a planarization layer on the thin film transistor;
    an anode on the planarization layer;
    an organic light emitting layer on the anode;
    a cathode on the organic light emitting layer;
    a first auxiliary line on the same layer and formed of the same material as the source electrode and the drain electrode; and
    a second auxiliary line and a third auxiliary line in a mesh structure on the same layer and formed of the same material as the anode,
    wherein the second auxiliary line extends to cross a plurality of first auxiliary lines with the inorganic layer and the planarization layer interposed therebetween, such that, the first auxiliary line and the second auxiliary line are formed in a mesh structure,
    wherein the first auxiliary line and the third auxiliary line are overlapped with each other, with the inorganic layer and the planarization layer interposed therebetween, and
    wherein the first auxiliary line directly contacts with the second auxiliary line via a contact hole passing through the inorganic layer and the planarization layer, such that the first auxiliary line is electrically connected with the cathode through the second auxiliary line.

2. The organic light emitting display device according to claim 1, wherein:
    the sub pixel region has a quadrangular shape, and
    the second auxiliary line extends parallel to a short side of the sub pixel region.

3. The organic light emitting display device according to claim 1, wherein the first auxiliary line and the second auxiliary line are electrically connected to each other at a point where both auxiliary lines cross each other with the planarization layer interposed therebetween.

4. The organic light emitting display device according to claim 1, further comprising:
    a Vdd voltage line disposed on the same layer and made of the same material as the first auxiliary line.

5. The organic light emitting display device according to claim 4, wherein the planarization layer and an inorganic layer are disposed between the Vdd voltage line and the second auxiliary line.

6. The organic light emitting display device according to claim 4, wherein at least one driving circuit is disposed between the voltage line and the first auxiliary line.

7. The organic light emitting display device according to claim 4, wherein:
    the Vdd voltage line includes a first Vdd voltage line and a second Vdd voltage line, and
    at least one driving circuit is disposed between the first Vdd voltage line and the second Vdd voltage line.

8. The organic light emitting display device according to claim 7, wherein:
    only a part of the first Vdd voltage line is vertically overlapped with the anode, and
    only a part of the second Vdd voltage line is vertically overlapped with the anode.

9. The organic light emitting display device according to claim 7, wherein the width of the first Vdd voltage line and the width of the second Vdd voltage line are the same as each other.

10. The organic light emitting display device according to claim 4, wherein:
    the pixel region includes four sub pixel regions, and
    four sub pixel regions emit light of different colors from each other.

11. The organic light emitting display device according to claim 10, further comprising:

a reference line disposed on the same layer and made of the same material as the first auxiliary line.

12. The organic light emitting display device according to claim 11, wherein two driving circuits are disposed between the Vdd voltage line and the reference line.

13. The organic light emitting display device according to claim 11, wherein:
the reference line supplies signals to four respective sub pixel regions through a first connection layer,
the voltage line supplies the signals to four respective sub pixel regions through a second connection layer, and
the first connection layer and the second connection layer are disposed on the same layer and made of the same material.

14. The organic light emitting display device according to claim 13, wherein:
the active layer is configured by an oxide semiconductor, and
the first connection layer and the second connection layer blocks light that is introduced into the active layer.

15. The organic light emitting display device according to claim 10, wherein:
the Vdd voltage line includes a first Vdd voltage line and a second Vdd voltage line,
at least one driving circuit is disposed between the first Vdd voltage line and the reference line, and
at least one driving circuit is disposed between the second Vdd voltage line and the reference line.

16. The organic light emitting display device according to claim 1, further comprising:
a partition disposed on the second auxiliary line.

17. A display device comprising:
a pixel array with each pixel having an organic light emitting layer between a cathode and an anode;
a TFT array under the pixel array, each TFT having a source electrode; and
an auxiliary electrode structure that minimizes voltage drop effects at the cathode by having a criss-cross layout with electrical contacts at each crossing point which results in maximized aperture ratio,
wherein the auxiliary electrode structure includes a plurality of first auxiliary electrodes, a plurality of second auxiliary electrodes and a plurality of third auxiliary electrodes, and the criss-cross layout is formed in a mesh structure by crossing the plurality of first auxiliary electrodes and the plurality of second auxiliary electrodes each other and by crossing the plurality of second auxiliary electrodes and the plurality of third auxiliary electrodes each other in a plan view, and
wherein the first auxiliary electrodes disposed on the same layer and made of the same material as the anode and the second auxiliary electrodes disposed on the same layer and made of the same material as the source electrode,
wherein the first auxiliary electrodes and the third auxiliary electrodes are overlapped with each other, with an inorganic layer and a planarization layer interposed therebetween, and
wherein the first auxiliary electrodes directly contact with the second auxiliary electrodes via contact holes passing through the inorganic layer and the planarization layer, such that the first auxiliary electrodes are electrically connected with the cathode through the second auxiliary electrodes.

* * * * *